(12) United States Patent
Natori et al.

(10) Patent No.: US 7,309,559 B2
(45) Date of Patent: Dec. 18, 2007

(54) RESIST PATTERN, PROCESS FOR PRODUCING SAME, AND UTILIZATION THEREOF

(75) Inventors: Michiko Natori, Hitachi (JP); Takahiro Hidaka, Hitachiota (JP)

(73) Assignee: Hitachi Chemical Co., Ltd., Tokyo (JP)

(*) Notice: Subject to any disclaimer, the term of this patent is extended or adjusted under 35 U.S.C. 154(b) by 50 days.

(21) Appl. No.: 10/381,671

(22) PCT Filed: Sep. 26, 2001

(86) PCT No.: PCT/JP01/08356

§ 371 (c)(1),
(2), (4) Date: Sep. 29, 2003

(87) PCT Pub. No.: WO02/27407

PCT Pub. Date: Apr. 4, 2002

(65) Prior Publication Data

US 2004/0063025 A1    Apr. 1, 2004

(30) Foreign Application Priority Data

Sep. 27, 2000  (JP)  ............... 2000-293255
Oct. 20, 2000  (JP)  ............... 2000-320168
Sep. 11, 2001  (JP)  ............... 2001-275523

(51) Int. Cl.
*G03F 7/00*   (2006.01)
*G03F 7/004*  (2006.01)

(52) U.S. Cl. ................................... 430/270.1

(58) Field of Classification Search ............. 430/270.1
See application file for complete search history.

(56) References Cited

U.S. PATENT DOCUMENTS

| | | | |
|---|---|---|---|
| 3,479,185 A | | 11/1969 | Chambers, Jr. |
| 4,629,680 A | * | 12/1986 | Iwasaki et al. ........... 430/288.1 |
| 5,238,782 A | * | 8/1993 | Kawamura et al. ...... 430/281.1 |
| 5,622,813 A | * | 4/1997 | Kanda et al. ............. 430/281.1 |
| 5,696,177 A | * | 12/1997 | Noguchi et al. ................ 522/31 |
| 5,863,704 A | * | 1/1999 | Sakurai et al. ........... 430/271.1 |
| 6,025,098 A | * | 2/2000 | Sakurai et al. ................. 430/18 |
| 7,067,226 B2 | * | 6/2006 | Kubota et al. .............. 430/258 |
| 7,067,228 B2 | * | 6/2006 | Kimura et al. ........... 430/270.1 |
| 7,078,151 B2 | * | 7/2006 | Aoki et al. ............... 430/271.1 |

FOREIGN PATENT DOCUMENTS

| | | |
|---|---|---|
| DE | 2027467 | 12/1971 |
| EP | 0011786 A2 | 11/1978 |
| EP | 0000220 A1 | 1/1979 |
| EP | 0000589 A1 | 2/1979 |
| JP | 05-102021 | 4/1993 |
| JP | 05-341526 | 12/1993 |
| JP | 05-341527 | 12/1993 |
| JP | 06-069631 | 3/1994 |
| JP | 06-282069 | 10/1994 |
| JP | 06-283830 | 10/1994 |
| JP | 06-291024 | 10/1994 |
| JP | 08-328265 | 12/1996 |
| JP | 10-110008 | 4/1998 |
| JP | 11-073874 | 3/1999 |
| JP | 11-102067 | 4/1999 |
| JP | 11-149157 | 6/1999 |
| JP | 11-327137 A2 | 11/1999 |
| WO | WO 02/25377 A1 * | 3/2002 |
| WO | WO 02/079878 A1 * | 10/2002 |

OTHER PUBLICATIONS

International Search Report (Form PCT/ISA/210) for International Appln. No. PCT/JP01/08356.
Michio Oda et al. "New High Resoulation Dry Film Photo Resist for High-End Packaging," Electronic Circuits World Convention, p. 1-4 (1999).
Yasushi Miyata "High Resoluation DFR for Semiconductor Packaging," Electronic Packaging Technology, Jun. 1998, pp. 62-65, vol. 14 No. 6.
1st Office Action from Chinese Patent Office, Sep. 3, 2004.

International Search Report (Form PCT/ISA/210) for International Appln. No. PCT/JP01/08356, Sep. 2001.

\* cited by examiner

*Primary Examiner*—Amanda Walke
(74) *Attorney, Agent, or Firm*—Griffin & Szipl, P.C.

(57) ABSTRACT

A resist pattern having a film thickness of 1 to 100 μm and an aspect ratio (ratio of the line width to the film thickness of the resist pattern) of 3.5 or higher is provided in accordance with the present invention, the resist pattern being useful for increasing the density of a semiconductor package substrate circuit, and use of the resist pattern enabling a low conductor resistance to be maintained in fine wiring.

This resist pattern can be produced using, for example, a photosensitive resin composition that includes (A) a binder polymer, (B1) a photopolymerizable compound having three ethylenically unsaturated bonds per molecule, (C) a photopolymerization initiator, and (D) either or both of a compound represented by general formula (I):

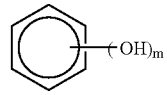

(I)

(in the formula, m is an integer of 2 to 6) or a compound represented by general formula (II).

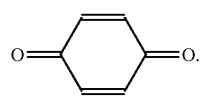

(II)

9 Claims, 5 Drawing Sheets

RESIST PATTERN, PROCESS FOR PRODUCING SAME, AND UTILIZATION THEREOF

This is a National Phase Application in the United States of International Patent Application No. PCT/JP01/08356 filed Sep. 26, 2001, which claims priority on Japanese Patent Application No. 2000-293255, filed Sep. 27, 2000; Japanese Patent Application No. 2000-320168, filed Oct. 20, 2000; and Japanese Patent Application No. 2001-275523, filed Sep. 11, 2001. The entire disclosures of the above patent applications are hereby incorporated by reference.

TECHNICAL FIELD

The present invention relates to a resist pattern, a photosensitive resin composition, a photosensitive element using this, a process for producing the resist pattern, and a process for producing a semiconductor package substrate.

BACKGROUND ART

Conventionally, in the field of printed wiring board production, semiconductor package substrate production, etc., with regard to resist materials used in etching, plating, etc., a photosensitive resin composition and a photosensitive element obtained from the photosensitive resin composition, a support, and a protective film are widely used. That is, after lamination of a photosensitive element to top of a copper substrate and pattern exposure, the cured portion is removed by a developing solution, the pattern is formed by etching (subtractive process) or plating (additive process), and the cured portion is then stripped off the substrate to give a wiring board or substrate.

Accompanying the miniaturization and increased functionality of electronic equipment in recent years, there has been a demand for an increase in the wiring line/space (L/S) density. There is also a desire, from the viewpoint of improving the workability, for a photosensitive resin composition that has high sensitivity and low plating bath contamination.

High sensitivity photopolymerization initiators are disclosed in German Patent No. 2,027,467, EP-A-11,786, EP-A-220, EP-A-589, JP-A-6-69631, etc. Furthermore, U.S. Pat. No. 3,479,185 discloses a photosensitive resin composition in which high sensitivity is achieved by a combination of a hydrogen-donating compound and a 2,4,5-triarylimidazole dimer, which is a photopolymerization initiator that gives little plating bath contamination.

However, the high sensitivity photopolymerization initiators disclosed in the above-mentioned specifications have the problem of plating bath contamination, and the case in which the 2,4,5-triarylimidazole dimer is used has the problem that if the amount thereof used is increased in order to adjust to a required sensitivity, then the resist line width increases, and if the amount of hydrogen-donating compound is increased, then the adhesion to copper and the storage stability deteriorate.

DISCLOSURE OF INVENTION

Currently, the line/space (L/S) density of wiring has increased to approximately 50 to 100 µm, and it can be expected that, in particular, substrates of semiconductor package such as BGA and CSP will be required to have a line/space (L/S) of 30 µm or less. Such a demand for higher density is expected to further increase in the future.

On the other hand, as the density of copper wiring increases, the wiring distance can be expected to be shorten, but since the increase in fineness of the wiring can be expected to be even more marked, the electrical resistance (conductor resistance) of the wiring increases, and an adverse effect on signal propagation, called RC delay, can be expected to occur. This conductor resistance is represented by formula (1) below:

$$R = \rho L/A \quad (1)$$

(in the formula, R represents the conductor resistance, ρ represents the conductor resistivity, L represents the conductor length, and A represents the conductor cross section.)

It can therefore be expected that in fine wiring it will be necessary to increase the copper thickness so as to increase the cross section in order to maintain a low conductor resistance. For example, when the pattern width is 6 µm, in order to obtain the same cross section as that of a copper wiring pattern having a pattern width of 10 µm and a copper thickness of 15 µm, it is necessary for the copper thickness to be 25 µm.

Taking the above points into consideration, in order to satisfy the requirement for higher density by increasing the resolution of a resist used in processing a package substrate, it is important to consider not only the line/space (L/S) value but also the ratio of the line width to the film thickness of the resist pattern, namely, the aspect ratio.

Moreover, taking into consideration the workability during resist stripping after plating, the required film thickness of the resist pattern is generally 1.2 times the thickness of copper plating, and it is therefore necessary for the film thickness of the resist to be 30 µm for a copper wiring pattern width of 6 µm. In this case, the aspect ratio of the resist pattern is required to be 5.0.

The aspect ratio referred to here is the ratio of the line width to the film thickness of the resist, that is, it can be represented by formula (2) below.

$$\text{Aspect ratio} = \text{Film thickness of resist pattern (µm)} / \text{line width of resist pattern (µm)} \quad (2)$$

As hereinbefore described, there is a desire for a photosensitive resin composition and a photosensitive element that can produce a resist pattern having a high aspect ratio, but this desire can not be satisfied by the conventional techniques since, if the adhesion of resist fine lines to a substrate is enhanced, the line width increases thereby degrading resolution, it is difficult to increase the contrast between an exposed area and an unexposed area so as to obtain an adequate aspect ratio and, furthermore, there is a tendency for the resist pattern to collapse due to the spray pressure of a developing solution, etc. during development.

It is therefore an object of the present invention to provide a high resolution resist pattern that is useful for increasing the density of a semiconductor package substrate circuit, use of the resist pattern enabling a low conductor resistance to be maintained in fine wiring (that is, in order to maintain a low conductor resistance in fine wiring, the copper film thickness can be increased so as to increase its cross section).

It is another object of the present invention to provide a photosensitive resin composition that can produce a resist pattern or a group of resist patterns which have high resolution and which are useful for increasing the density of a semiconductor package substrate circuit, use of the resist pattern enabling a low conductor resistance to be maintained in fine wiring.

It is yet another object of the present invention to provide a photosensitive resin composition that can provide a resist pattern having high resolution and a high aspect ratio, the photosensitive resin composition having excellent sensitivity, resolution, resistance to scumming, and plating resistance, and being useful for increasing the density of a semiconductor package substrate circuit.

It is a further object of the present invention to provide a photosensitive element that can provide a resist pattern having high resolution and a high aspect ratio, the photosensitive element having excellent sensitivity, resolution, resistance to scumming, and plating resistance, and being useful for increasing the density of a semiconductor package substrate circuit.

It is a still further object of the present invention to provide a process for producing a resist pattern, the process being capable of producing a high resolution resist pattern with good productivity and workability, and the resist pattern enabling a low conductor resistance to be maintained in fine wiring and being useful for increasing the density of a semiconductor package substrate circuit.

It is yet another object of the present invention to provide a process for producing a semiconductor package substrate that is useful for increasing the density of a semiconductor package substrate circuit, the process enabling fine wiring with the conductor resistance maintained low to be carried out with good workability and productivity.

A first aspect of the present invention provides a resist pattern having a film thickness of 1 to 100 μm and an aspect ratio (ratio of the line width to the film thickness of the resist pattern) of 3.5 or higher.

A second aspect of the present invention provides a photosensitive resin composition that can produce a resist pattern having a film thickness of 1 to 100 μm and an aspect ratio (ratio of the line width to the film thickness of the resist pattern) of 3.5 or higher.

A third aspect of the present invention provides a photosensitive resin composition that can produce a group of resist patterns in which a resist pattern having a film thickness of 1 to 100 μm and an aspect ratio (ratio of the line width to the film thickness of the resist pattern) of 3.5 or higher is adjacent, via a space having the same width as the line width of the resist pattern, to a resist pattern having a film thickness of 1 to 100 μm and an aspect ratio (ratio of the line width to the film thickness of the resist pattern) of 3.5 or higher.

A fourth aspect of the present invention provides a photosensitive resin composition that includes (A) a binder polymer, (B1) a photopolymerizable compound having three ethylenically unsaturated bonds per molecule, (C) a photopolymerization initiator, and (D) either or both of a compound represented by general formula (I):

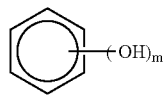

(in the formula, m is an integer of 2 to 6) or a compound represented by general formula (II).

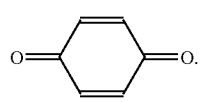

A fifth aspect of the present invention provides a photosensitive resin composition that includes (A) a binder polymer, (B) a photopolymerizable compound having at least one ethylenically unsaturated bond per molecule, (C) a photopolymerization initiator, and (E) a leuco dye, the amount of component (E) added being 0.3 to 0.6 parts by weight relative to 100 parts by weight of the total of component (A) and component (B).

A sixth aspect of the present invention provides a photosensitive resin composition that includes (A) a binder polymer, (B) a photopolymerizable compound having at least one ethylenically unsaturated bond per molecule, and (C) a photopolymerization initiator, the component (C) including an N,N'-tetraalkyl-4,4'-diaminobenzophenone at 0.04 to 0.08 parts by weight relative to 100 parts by weight of the total of component (A) and component (B).

A seventh aspect of the present invention provides a photosensitive element that is obtained by forming on a support a resist layer formed from the photosensitive resin composition according to the above-mentioned present invention.

An eighth aspect of the present invention provides a process for producing a resist pattern having an aspect ratio (ratio of the line width to the film thickness of the resist pattern) of 3.5 or higher using the photosensitive resin composition according to the present invention, the process including the following steps:

i) a step of forming on a substrate at a dry film thickness of 1 to 100 μm a resist layer formed from the photosensitive resin composition according to the present invention;

ii) a step of imagewise exposing the resist layer to actinic radiation so that an exposed area thereof is light cured; and iii) a step of selectively removing an unexposed area of the resist layer by development.

A ninth aspect of the present invention provides a process for producing a resist pattern having an aspect ratio (ratio of the line width to the film thickness of the resist pattern) of 3.5 or higher, the process including the following steps:

i) a step of forming on a substrate at a dry film thickness of 1 to 100 μm a resist layer formed from a photosensitive resin composition, the resist layer having an absorbance of 0.50 or less at an actinic radiation wavelength of 365 nm;

ii) a step of imagewise exposing the resist layer to actinic radiation so that an exposed area thereof is light cured; and iii) a step of selectively removing an unexposed area of the resist layer by development.

A tenth aspect of the present invention provides a process for producing a resist pattern having an aspect ratio (ratio of the line width to the film thickness of the resist pattern) of 3.5 or higher, the process including the following steps:

i) a step of forming on a substrate at a dry film thickness of 1 to 100 μm a resist layer formed from a photosensitive resin composition;

ii) a step of imagewise exposing the resist layer to actinic radiation through a glass negative pattern so that an exposed area thereof is light cured; and iii) a step of selectively removing an unexposed area of the resist layer by development.

An eleventh aspect of the present invention provides a process for producing a resist pattern having an aspect ratio (ratio of the line width to the film thickness of the resist pattern) of 3.5 or higher, the process including the following steps:

i) a step of forming on a substrate at a dry film thickness of 1 to 100 μm a resist layer formed from a photosensitive resin composition;

ii) a step of imagewise exposing the resist layer to a collimated light beam so that an exposed area thereof is light cured; and iii) a step of selectively removing an unexposed area of the resist layer by development.

A twelfth aspect of the present invention provides a process for producing a resist pattern having an aspect ratio (ratio of the line width to the film thickness of the resist pattern) of 3.5 or higher using the photosensitive element according to the present invention, the process including the following steps:

i) a step of laminating to a substrate the photosensitive element according to the present invention, the photosensitive element being obtained by forming on a support a resist layer formed from the photosensitive resin composition according to the present invention, in such a manner that the resist layer is bonded to a surface of the substrate;

ii) a step of imagewise exposing the resist layer to actinic radiation so that an exposed area thereof is light cured; and iii) a step of selectively removing an unexposed area of the resist layer by development.

A thirteenth aspect of the present invention provides a process for producing a semiconductor package substrate wherein a circuit is formed by subjecting to an additive process a substrate on which the resist pattern according to the present invention has been produced.

A fourteenth aspect of the present invention provides a process for producing a semiconductor package substrate wherein a circuit is formed by subjecting to an additive process a substrate on which a resist pattern has been produced by the process for producing a resist pattern according to the present invention.

BEST MODE FOR CARRYING OUT THE INVENTION

Figure 1:
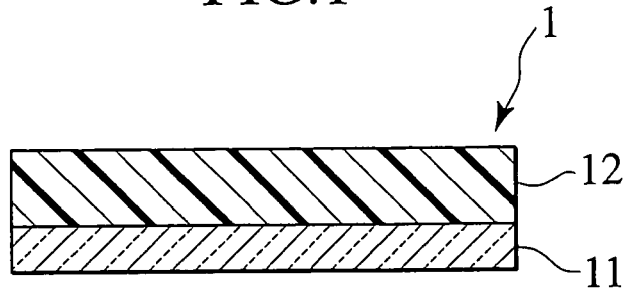
FIG. 1 is a schematic drawing showing an embodiment of the photosensitive element according to the present invention.

A mode for carrying out the present invention is explained in detail below. In the present invention a (meth)acrylic acid denotes an acrylic acid and the corresponding methacrylic acid, a (meth)acrylate denotes an acrylate and the corresponding methacrylate, and a (meth)acryloyl group denotes an acryloyl group and the corresponding methacryloyl group.

The resist pattern according to the present invention has a film thickness of 1 to 100 μm and an aspect ratio (ratio of the line width to the film thickness of the resist pattern) of 3.5 or higher. Satisfying these requirements can provide a high resolution resist pattern in which a low conductor resistance is maintained for fine wiring, and which is useful for increasing the density of a semiconductor package substrate circuit.

With regard to techniques for producing such a resist pattern, for example, there are methods a to h below, and carrying out methods a to h singly or in an appropriate combination of a plurality thereof can produce such a resist pattern.

Method a: as a resist material, a photosensitive resin composition is used that is capable of producing a resist pattern having a film thickness of 1 to 100 μm and an aspect ratio (ratio of the line width to the film thickness of the resist pattern) of 3.5 or higher.

Method b: as a resist material, a photosensitive resin composition is used that is capable of producing a group of resist patterns in which a resist pattern having a film thickness of 1 to 100 μm and an aspect ratio (ratio of the line width to the film thickness of the resist pattern) of 3.5 or higher is adjacent, via a space having the same width as the line width of the resist pattern, to a resist pattern having a film thickness of 1 to 100 μm and an aspect ratio (ratio of the line width to the film thickness of the resist pattern) of 3.5 or higher.

Method c: as a resist material, a photosensitive resin composition is used that includes (A) a binder polymer, (B1) a photopolymerizable compound having three ethylenically unsaturated bonds per molecule, (C) a photopolymerization initiator, and (D) either or both of a compound represented by general formula (I):

(in the formula, m is an integer of 2 to 6) or a compound represented by formula (II).

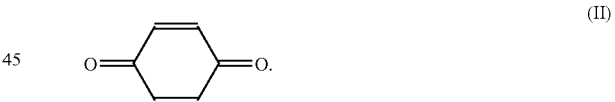

Method d: as a resist material, a photosensitive resin composition is used that includes (A) a binder polymer, (B) a photopolymerizable compound having at least one ethylenically unsaturated bond per molecule, (C) a photopolymerization initiator, and (E) a leuco dye, the amount of the component (E) added being 0.3 to 0.6 parts by weight relative to 100 parts by weight of the total of component (A) and component (B).

Method e: as a resist material, a photosensitive resin composition is used that includes (A) a binder polymer, (B) a photopolymerizable compound having at least one ethylenically unsaturated bond per molecule, and (C) a photopolymerization initiator, an N,N'-tetraalkyl-4,4'-diaminobenzophenone being included as the component (C) at 0.04 to 0.08 parts by weight relative to 100 parts by weight of the total of component (A) and component (B).

Method f: as a resist material, a photosensitive resin composition is used that can form a resist layer having an absorbance of 0.50 or less at an actinic radiation wavelength of 365 nm, this is applied as a layer on a substrate at a dry film thickness of 1 to 100 μm to give a resist layer, the resist layer is imagewise exposed to actinic radiation so that an exposed area thereof is light cured, and an unexposed area of the resist layer is removed by development.

Method g: a resist layer formed from a photosensitive resin composition is formed on a substrate at a dry film thickness of 1 to 100 μm, the resist layer is imagewise exposed to actinic radiation through a glass negative pattern so that an exposed area thereof is light cured, and an unexposed area of the resist layer is removed by development.

Method h: a resist layer formed from a photosensitive resin composition is formed on a substrate at a dry film thickness of 1 to 100 μm, the resist layer is imagewise exposed to a collimated light beam so that an exposed area thereof is light cured, and an unexposed area of the resist layer is removed by development.

In the above-mentioned methods a and b, it is preferable to include, as specific components, (B1) the photopolymerizable compound having three ethylenically unsaturated bonds per molecule and either one or both of (D) the compound represented by general formula (I) above or the compound represented by formula (II) above.

In the above-mentioned methods c, d, and e, it is preferable to further include at least one type of compound from (B2) a 2,2-bis(4-((meth)acryloxypolyalkoxy)phenyl) propane, (B3) a polyalkylene glycol di(meth)acrylate, and (B4) a compound having at least one ethylenically unsaturated bond and at least one phenyl or phenylene group per molecule. Furthermore, it is preferable to include a 2,4,5-triarylimidazole dimer as the photopolymerization initiator (C). Moreover, in the methods d and e, it is preferable to include the component (B1) above as the component (B).

Each of the components of the photosensitive resin composition that is preferably used for forming the resist pattern according to the present invention is explained below.

Examples of the binder polymer (A) include an acrylic resin, a styrene resin, an epoxy resin, an amide resin, an amide epoxy resin, an alkyd resin, and a phenol resin. From the viewpoint of the alkaline development properties, the acrylic resin is preferable.

It is also possible to use as the component (A) a product of radical polymerization of a polymerizable monomer. Examples of the polymerizable monomer include styrene, polymerizable styrene derivatives such as vinyltoluene, α-methylstyrene, p-methylstyrene, and p-ethylstyrene, acrylamide, acrylonitrile, an ester of a vinylalcohol such as vinyl n-butyl ether, an alkyl (meth)acrylate ester, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chloro(meth)acrylic acid, β-furyl(meth)acrylic acid, β-styryl(meth)acrylic acid, maleic acid, maleic anhydride, monoesters of maleic acid such as monomethyl maleate, monoethyl maleate, and monoisopropyl maleate, fumaric acid, cinnamic acid, α-cyanocinnamic acid, itaconic acid, crotonic acid, and propiolic acid. They can be used singly or in a combination of two or more types.

Examples of the alkyl (meth)acrylate ester include methyl (meth)acrylate, ethyl (meth)acrylate, propyl (meth)acrylate, butyl (meth)acrylate, pentyl (meth)acrylate, hexyl (meth) acrylate, heptyl (meth)acrylate, octyl (meth)acrylate, 2-ethylhexyl (meth)acrylate, and structural isomers thereof. They can be used singly or in a combination of two or more types.

From the viewpoint of the alkaline development properties, it is preferable for the component (A) to have a carboxyl group, and the component (A) can be produced by, for example, radical polymerization of a polymerizable monomer having a carboxyl group and another polymerizable monomer. With regard to the polymerizable monomer having a carboxyl group, methacrylic acid is preferable. Furthermore, from the viewpoint of flexibility, the component (A) preferably includes styrene or a styrene derivative as a polymerizable monomer. In order to maintain both good adhesion and good stripping properties while including styrene or a styrene derivative as a comonomer component, the proportion of styrene or styrene derivative in the copolymer is preferably at least 3 wt % from the viewpoint of the adhesion, preferably at most 30 wt % from the viewpoint of the size of stripped pieces and the stripping time, more preferably 4 to 28 wt %, and particularly preferably 5 to 27 wt %.

The acid value of the component (A) is preferably at least 30 mg KOH/g from the viewpoint of development time, preferably at most 200 mg KOH/g from the viewpoint of resistance to the developing solution of a light cured resist, and more preferably 50 to 150 mg KOH/g.

The weight-average molecular weight of the component (A) (measured by gel permeation chromatography (GPC) and converted by means of a calibration curve prepared using a polystyrene standard) is preferably at least 20,000 from the viewpoint of the resistance to the developing solution, preferably at most 300,000 from the viewpoint of the development time, and more preferably 30,000 to 150,000.

These binder polymers are used singly or in a combination of two or more types. Examples of the combination of two or more types of binder polymers include a combination of two or more binder polymers of types that are different from each other, a combination of two or more types of binder polymers formed from different comonomers, a combination of two or more types of binder polymers having different weight-average molecular weights, and a combination of two or more types of binder polymers having different dispersities. It is also possible to use a polymer having a multimodal molecular weight distribution disclosed in JP-A-11-327137. These binder polymers may have a photosensitive group as necessary.

With regard to the photopolymerizable compound (B) having at least one ethylenically unsaturated bond per molecule, for example, a radically polymerizable compound can be preferably used. The ethylenically unsaturated bond referred to here denotes a polymerizable ethylenically unsaturated bond. Specific examples include a compound obtained by reacting a polyhydric alcohol with an α,β-unsaturated carboxylic acid, various types of bisphenol A (meth)acrylate compound, which will be described later as component (B2), a compound obtained by reacting a compound having a glycidyl group with an α,β-unsaturated carboxylic acid, a urethane monomer such as a (meth) acrylate compound having a urethane bond in the molecule, various types of nonylphenoxypolyethyleneoxy (meth)acrylate, which will be described later as component (B4), phthalic acid compounds such as γ-chloro-β-hydroxypropyl-β'-(meth)acryloyloxyethyl o-phthalate and a β-hydroxyalkyl-β'-(meth)acryloyloxyalkyl o-phthalate, and alkyl (meth)acrylate esters. They can be used singly or in a combination of two or more types.

Examples of the compound obtained by reacting a polyhydric alcohol with an α,β-unsaturated carboxylic acid include various types of polyalkylene glycol di(meth)acrylate, which will be described later as component (B3), trimethylolpropane di(meth)acrylate, various types of tri(meth)acrylate compound, which will be described later as component (B1), tetramethylolmethane tetra(meth)acrylate, dipentaerythritol penta(meth)acrylate, and dipentaerythritol hexa(meth)acrylate.

Examples of the (meth)acrylate compound having a urethane bond in the molecule include an adduct of a (meth)acrylic monomer having an OH group in a β-position with a diisocyanate compound such as isophorone diisocyanate, 2,6-toluene diisocyanate, 2,4-toluene diisocyanate, or 1,6-hexamethylene diisocyanate, tris((meth)acryloxytetraethylene glycol isocyanate)hexamethylene isocyanurate, an EO-modified urethane di(meth)acrylate, and an EO- and PO-modified urethane di(meth)acrylate. Examples of the EO-modified urethane di(meth)acrylate include UA-11 (product name, manufactured by Shin-Nakamura Chemical Co., Ltd.) Examples of the EO- and PO-modified urethane di(meth)acrylate include UA-13 (product name, manufactured by Shin-Nakamura Chemical Co., Ltd.)

In a preferred embodiment, the photopolymerizable compound (B1) having three ethylenically unsaturated bonds per molecule can be used as the component (B). By including the component (B1) the resist cross-linking density can be improved, which is effective in preventing collapse of the resist pattern.

The component (B1) is not particularly limited as long as it has three ethylenically unsaturated bonds per molecule, and examples thereof include trimethylolpropane tri(meth)acrylate, an EO-modified trimethylolpropane tri(meth)acrylate, a PO-modified trimethylolpropane tri(meth)acrylate, an EO- and PO-modified trimethylolpropane tri(meth)acrylate, pentaerythritol tri(meth)acrylate, an EO-modified pentaerythritol tri(meth)acrylate, a PO-modified pentaerythritol tri(meth)acrylate, an EO- and PO-modified pentaerythritol tri(meth)acrylate, tetramethylolmethane tri(meth)acrylate, an EO-modified tetramethylolmethane tri(meth)acrylate, a PO-modified tetramethylolmethane tri(meth)acrylate, and an EO- and PO-modified tetramethylolmethane tri(meth)acrylate. Available examples thereof include A-TTM-3 (trade name, tetramethylolmethane triacrylate manufactured by Shin-Nakamura Chemical Co., Ltd.) and TMPT21E and TMPT30E (sample names, EO-modified trimethylolpropane trimethacrylate, produced by Hitachi Chemical Co., Ltd.) They can be used singly or in a combination of two or more types. The EO above denotes ethylene oxide, and an EO-modified compound has an ethylene oxide block structure. The PO above denotes propylene oxide, and a PO-modified compound has a propylene oxide block structure.

In another preferred embodiment, the 2,2-bis(4-((meth)acryloxypolyalkoxy)phenyl)propane (B2) can be used in order to further improve the resolution, the resistance to scumming, and the plating resistance. Examples of the component (B2) include a 2,2-bis(4-((meth)acryloxypolyethoxy)phenyl)propane, a 2,2-bis(4-((meth)acryloxypolypropoxy)phenyl)propane, a 2,2-bis(4-((meth)acryloxypolybutoxy)phenyl)propane, and a 2,2-bis(4-((meth)acryloxypolyethoxypolypropoxy)phenyl) propane. The plurality of alkoxy groups in the component (B2) may be identical to each other or different from each other. When two or more types of alkoxy groups are present, the two or more types of alkoxy groups may be present randomly or as blocks. Examples of such a compound having two or more types of alkoxy groups include the 2,2-bis(4-((meth)acryloxypolyethoxypolypropoxy)phenyl) propane. These components (B2) can be used singly or in a combination of two or more types.

Examples of the 2,2-bis(4-((meth)acryloxypolyethoxy)phenyl)propane include those having 2 to 16 ethoxy groups; specific examples thereof include 2,2-bis(4-((meth)acryloxydiethoxy)phenyl)propane, 2,2-bis(4-((meth)acryloxytriethoxy)phenyl)propane, 2,2-bis(4-((meth)acryloxytetraethoxy)phenyl)propane, 2,2-bis(4-((meth)acryloxypentaethoxy)phenyl)propane, 2,2-bis(4-((meth)acryloxyhexaethoxy)phenyl)propane, 2,2-bis(4-((meth)acryloxyheptaethoxy)phenyl)propane, 2,2-bis(4-((meth)acryloxyoctaethoxy)phenyl)propane, 2,2-bis(4-((meth)acryloxynonaethoxy)phenyl)propane, 2,2-bis(4-((meth)acryloxydecaethoxy)phenyl)propane, 2,2-bis(4-((meth)acryloxyundecaethoxy)phenyl)propane, 2,2-bis(4-((meth)acryloxydodecaethoxy)phenyl)propane, 2,2-bis(4-((meth)acryloxytridecaethoxy)phenyl)propane, 2,2-bis(4-((meth)acryloxytetradecaethoxy)phenyl)propane, 2,2-bis(4-((meth)acryloxypentadecaethoxy)phenyl)propane, and 2,2-bis(4-((meth)acryloxyhexadecaethoxy)phenyl)propane. 2,2-Bis(4-(methacryloxypentaethoxy)phenyl)propane is commercially available as BPE-500 (trade name, manufactured by Shin-Nakamura Chemical Co., Ltd.) and 2,2-bis(4-(methacryloxypentadecaethoxy)phenyl)propane is commercially available as BPE-1300 (trade name, manufactured by Shin-Nakamura Chemical Co., Ltd.). They can be used singly or in a combination of two or more types.

Examples of the 2,2-bis(4-((meth)acryloxypolyethoxypolypropoxy)phenyl) propane include 2,2-bis(4-((meth)acryloxydiethoxyoctapropoxy)phenyl) propane, 2,2-bis(4-((meth)acryloxytetraethoxytetrapropoxy) phenyl)propane, and 2,2-bis(4-((meth)acryloxyhexaethoxyhexapropoxy)phenyl) propane. They can be used singly or in a combination of two or more types.

In another preferred embodiment, in order to further improve various resist properties such as the resolution, the resistance to scumming, and the plating resistance, the polyalkylene glycol di(meth)acrylate (B3) can be used. Specific examples thereof include a polyethylene glycol di(meth)acrylate having 2 to 14 ethylene groups, a polypropylene glycol di(meth)acrylate having 2 to 14 propylene groups, and a polybutylene glycol di(meth)acrylate having 2 to 14 butylene groups, and from the viewpoint of sensitivity and the resistance to scumming, a diacrylate compound is preferable. From the viewpoint of the resolution and the adhesion, a polyethylene glycol dimethacrylate is preferable. They can be used singly or in a combination of two or more types.

In this component (B3), the plurality of alkylene glycol chains may be identical to each other or different from each other. When two or more types of alkylene glycol chains are present, the two or more types of alkylene glycol chains may be present randomly or as blocks. Examples of the above-mentioned compound having two or more types of alkoxy groups include a polyethylene/polypropylene glycol di(meth)acrylate having 2 to 14 ethylene groups and 2 to 14 propylene groups.

In another preferred embodiment, in order to further improve the resistance to scumming and the stripping properties, the compound (B4) having at least one ethylenically unsaturated bond and at least one phenyl or phenylene group per molecule can be used. The component (B4) is not particularly limited as long as it has at least one ethylenically unsaturated bond per molecule and at least one phenyl or phenylene group per molecule, and examples thereof include compounds represented by general formula (III) below:

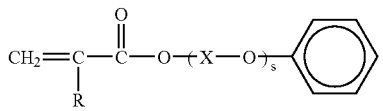

(III)

(R denotes a hydrogen atom or a methyl group, X denotes an alkylene group having 2 to 20 carbons, and s is an integer of 1 to 30), and a phthalic acid compound, and a compound represented by general formula (III) above is preferable. The above-mentioned phenyl or phenylene group may have any substituent. X in general formula (III) above is preferably an ethylene group.

Examples of the substituent on the phenyl or phenylene group include a halogen atom, an alkyl group having 1 to 20 carbons, a cycloalkyl group having 3 to 10 carbons, an aryl group having 6 to 14 carbons, an amino group, an alkylamino group having 1 to 10 carbons, a dialkylamino group having 2 to 20 carbons, a nitro group, a cyano group, a mercapto group, an alkylmercapto group having 1 to 10 carbons, an allyl group, a hydroxyalkyl group having 1 to 20 carbons, a carboxyalkyl group whose alkyl group has 1 to 10 carbons, an acyl group whose alkyl group has 1 to 10 carbons, an alkoxy group having 1 to 20 carbons, and a group containing a heterocycle. It is also possible for a hydrogen atom of the alkyl group to be replaced by a halogen atom. From the viewpoint of the resistance to the developing solution, the development properties, and the adhesion, an alkyl group having 1 to 20 carbons is preferable, an alkyl group having 4 to 14 carbons is more preferable, and a nonyl group is particularly preferable. The number of substituents is preferably 0 to 5, more preferably 1 to 4, particularly preferably 1 to 3, and most preferably 1 or 2. When the number of substituents is two or more, the two or more substituents may be identical to each other or different from each other.

Examples of the compound represented by general formula (III) above include a nonylphenoxypolyethyleneoxy meth(acrylate), a nonylphenoxypolypropyleneoxy (meth) acrylate, a butylphenoxypolyethyleneoxy (meth)acrylate, and a butylphenoxypolypropyleneoxy (meth)acrylate. From the viewpoint of the resistance to scumming, a nonylphenoxypolyethyleneoxy acrylate is preferable. They can be used singly or in a combination of two or more types.

Examples of the nonylphenoxypolyethyleneoxy (meth) acrylate include nonylphenoxytetraethyleneoxy (meth)acrylate, nonylphenoxypentaethyleneoxy (meth)acrylate, nonylphenoxyhexaethyleneoxy (meth)acrylate, nonylphenoxyheptaethyleneoxy (meth)acrylate, nonylphenoxyoctaethyleneoxy (meth)acrylate, nonylphenoxynonaethyleneoxy (meth)acrylate, nonylphenoxydecaethyleneoxy (meth)acrylate, nonylphenoxyundecaethyleneoxy (meth) acrylate, and nonylphenoxydodecaethyleneoxy (meth)acrylate. Examples of available compounds include NP-8EA and NP-4EA (trade names, manufactured by Kyoeisha Chemical Co., Ltd.) They can be used singly or in a combination of two or more types.

With regard to the photopolymerization initiator (C), examples thereof include benzophenone, N,N'-tetraalkyl-4, 4'-diaminobenzophenones such as N,N'-tetramethyl-4,4'-diaminobenzophenone (Michler's ketone), aromatic ketones such as 2-benzyl-2-dimethylamino-1-(4-morpholinophenyl)-butanone-1 and 2-methyl-1-[4-(methylthio)phenyl]-2-morpholinopropanone-1, quinones such as alkylanthraquinones, benzoin ether compounds such as benzoin alkyl ethers, benzoin compounds such as benzoin and alkylbenzoins, benzil derivatives such as benzil dimethyl ketal, 2,4,5-triarylimidazole dimers such as 2-(o-chlorophenyl)-4, 5-diphenylimidazole dimer, 2-(o-chlorophenyl)-4,5-di (methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer, acridine derivatives such as 9-phenylacridine and 1,7-bis(9,9'-acridinyl)heptane, N-phenylglycine, N-phenylglycine derivatives, and coumarin compounds. They can be used singly or in a combination of two or more types. Various properties of the photosensitive resin composition such as high sensitivity and low plating bath contamination depend on the type and the amount of photopolymerization initiator used.

Among the above-mentioned components (C), in order to further improve the sensitivity, the resolution, and the plating resistance and, in particular, from the viewpoint of the adhesion and the sensitivity, it is preferable to use a 2,4,5-triarylimidazole dimer. The substituents on the aryl groups of the two 2,4,5-triarylimidazoles may be identical to each other so as to give a symmetric compound or may be different from each other to give an asymmetric compound.

It is preferable to add an N,N'-tetraalkyl-4,4'-diaminobenzophenone such as N,N'-tetramethyl-4,4'-diaminobenzophenone (Michler's ketone), and from the viewpoint of increasing the curability at the bottom of the resist by increasing the light transmittance of the resist so as to adjust the absorbance, the amount of N,N'-tetraalkyl-4,4'-diaminobenzophenone added is preferably 0.04 to 0.08 parts by weight relative to the total of component (A) and component (B), more preferably 0.04 to 0.07 parts by weight, particularly preferably 0.045 to 0.06 parts by weight, and most preferably 0.045 to 0.05 parts by weight.

In another preferred embodiment, in order to improve the contrast and achieve a high aspect ratio by suppressing effectively unwanted gelling due to scattered light, etc., either or both of a compound represented by general formula (I) above or a compound represented by general formula (II) above can be used as component (D). From the viewpoint of the resolution, it is preferable to use a compound represented by general formula (I). Use of the component (D) can further improve the resolution and the plating resistance.

Each of the compounds represented by general formulae (I) and (II) above can have any substituent, and when there are a plurality of substituents, the plurality of substituents may be identical to each other or different from each other. The number of these substituents is preferably 0 to 4, more preferably 0 to 3, particularly preferably 0 to 2, very preferably 0 to 1, and most preferably 1.

Examples of the substituent include a halogen atom such as fluorine, chlorine, iodine, or astatine, an alkyl group having 1 to 20 carbons, a cycloalkyl group having 3 to 10 carbons, an aryl group such as a phenyl group or a naphthyl group, which may be substituted with an amino group or an alkyl group having 1 to 20 carbons, an amino group, a mercapto group, an alkylmercapto group having 1 to 10 carbons, a carboxyalkyl group whose alkyl group has 1 to 10 carbons, an alkoxy group having 1 to 20 carbons, and a group formed from a heterocycle, and it is preferable for the substituent to be an alkyl group.

Examples of the alkyl group having 1 to 20 carbons include methyl, ethyl, n-propyl, iso-propyl, n-butyl, sec-butyl, tert-butyl, pentyl, hexyl, heptyl, octyl, nonyl, decyl, undecyl, tridecyl, tetradecyl, pentadecyl, octadecyl, nonadecyl, icosyl, and structural isomers thereof; it is preferable to use a butyl group such as n-butyl, sec-butyl, or tert-butyl, and it is more preferable to use tert-butyl. Examples of the above-mentioned cycloalkyl group having 3 to 10 carbons include cyclopropyl, cyclobutyl, cyclopentyl, cyclohexyl, and cyclooctyl. Examples of the aryl group substituted with an alkyl group having 1 to 20 carbons include methylphenyl, ethylphenyl, and propylphenyl.

Examples of the alkylmercapto group having 1 to 10 carbons include methylmercapto, ethylmercapto, and propylmercapto. Examples of the carboxyalkyl group whose alkyl group has 1 to 10 carbons include a carboxymethyl group, a carboxyethyl group, a carboxypropyl group, and a carboxybutyl group. Examples of the alkoxy group having 1 to 20 carbons include methoxy, ethoxy, and propoxy. Examples of the group formed from a heterocycle include an ethylene oxide group, a furan group, a thiophene group, a pyrrole group, a thiazole group, an indole group, and a quinoline group.

In the above-mentioned general formula (I), m is an integer of 2 to 6, preferably an integer of 2 to 4, more preferably an integer of 2 to 3, and most preferably 2. When m is less than 2, the resolution deteriorates.

Examples of the compound represented by general formula (I) include catechol, resorcinol, 1,4-hydroquinone, alkylcatechols such as 2-methylcatechol, 3-methylcatechol, 4-methylcatechol, 2-ethylcatechol, 3-ethylcatechol, 4-ethylcatechol, 2-propylcatechol, 3-propylcatechol, 4-propylcatechol, 2-n-butylcatechol, 3-n-butylcatechol, 4-n-butylcatechol, 2-tert-butylcatechol, 3-tert-butylcatechol, 4-tert-butylcatechol, and 3,5-di-tert-butylcatechol, alkylresorcinols such as 2-methylresorcinol, 4-methylresorcinol, 2-ethylresorcinol, 4-ethylresorcinol, 2-propylresorcinol, 4-propylresorcinol, 2-n-butylresorcinol, 4-n-butylresorcinol, 2-tert-butylresorcinol, and 4-tert-butylresorcinol, alkylhydroquinones such as methylhydroquinone, ethylhydroquinone, propylhydroquinone, tert-butylhydroquinone, and 2,5-di-tert-butylhydroquinone, pyrogallol, and phloroglucinol; it is preferable to use catechol, an alkylcatechol, an alkylhydroquinone, or hydroquinone, and among the alkylcatechols it is particularly preferable to use 4-tert-butylcatechol. They can be used singly or in a combination of two or more types. Examples of the compound represented by general formula (II) above include o-benzoquinone and p-benzoquinone.

In another preferred embodiment, the leuco dye (E) can be used as a hydrogen donor, and optimizing the amount of component (E) added can improve the cure degree of the entire resist layer. Specific examples of the leuco dye include leuco crystal violet (tris(4-dimethylaminophenyl)methane), tris(4-diethylamino-2-methylphenyl)methane, leuco malachite green, leuco aniline, and leuco methyl violet, and from the viewpoint of a high hydrogen donating ability and the resolution not being degraded it is preferable to use leuco crystal violet. The amount thereof added is preferably 0.3 to 0.6 parts by weight relative to the total of component (A) and component (B), more preferably 0.3 to 0.5 parts by weight, and particularly preferably 0.35 to 0.45 parts by weight.

In another preferred embodiment, in order to improve the curability at the bottom of the resist by increasing the light transmittance of the resist so as to adjust the absorbance and achieve resolution and a high aspect ratio, it is possible to use a photosensitive resin composition that can form a resist layer having an absorbance of 0.50 or less at a wavelength of 365 nm, which is the main actinic radiation output wavelength of an exposure unit used for exposure of an ordinary photosensitive film. As long as the absorbance of the resist layer (photosensitive resin composition layer) is equal to or less than 0.50, the film thickness of the resist layer can be set freely in a dry film thickness range of 1 to 100 μm.

Preferable amounts of each of the components to be added are now explained. The amount of component (A) added is preferably at least 40 parts by weight relative to 100 parts by weight of the total of component (A) and component (B) from the viewpoint of the hardness (brittleness) of a light cured product and the coating properties when used as a photosensitive element, preferably at most 80 parts by weight from the viewpoint of photosensitivity, and more preferably 45 to 70 parts by weight.

The amount of component (B) added is preferably at least 20 parts by weight relative to 100 parts by weight of the total of component (A) and component (B) from the viewpoint of the photosensitivity, preferably at most 60 parts by weight from the viewpoint of the hardness (brittleness) of the light cured product, and more preferably 30 to 55 parts by weight.

The proportion of component (B1) in component (B) is preferably at least 2 wt % from the viewpoint of the sensitivity and the resolution, preferably at most 40 wt % from the viewpoint of the stripping time, and more preferably 3 to 35 wt %. The proportion of component (B2) in component (B) is preferably at least 10 wt % from the viewpoint of the resolution, preferably at most 90 wt % from the viewpoint of the stripping time, and more preferably 20 to 80 wt %. The proportion of component (B3) in component (B) is preferably at least 5 wt % from the viewpoint of the sensitivity and the adhesion of fine lines, preferably at most 60 wt % from the viewpoint of tackiness, and more preferably 10 to 30 wt %. The proportion of component (B4) in component (B) is preferably at least 4 wt % from the viewpoint of the stripping time, preferably at most 20 wt % from the viewpoint of the adhesion of fine lines, and more preferably 6 to 12 wt %.

The amount of component (C) added is preferably at least 0.1 parts by weight relative to 100 parts by weight of the total of component (A) and component (B) from the viewpoint of the photosensitivity, preferably at most 10.0 parts by weight from the viewpoint of the curability of the bottom of the resist and the scumming, and more preferably 0.5 to 6.0 parts by weight.

The amount of component (D) added is preferably at least 0.001 parts by weight relative to 100 parts by weight of the total of component (A) and component (B) from the viewpoint of the resolution, preferably at most 3 parts by weight from the viewpoint of the sensitivity, and more preferably 0.01 to 0.1 parts by weight.

Furthermore, the photosensitive resin composition can contain, as necessary, a cationic polymerization initiator, a dye such as malachite green, a photo-coloring agent such as tribromophenylsulfone or leuco crystal violet, a thermal coloration inhibitor, a plasticizer such as p-toluenesulfonamide, a pigment, a filler, an anti-foaming agent, a flame retardant, a stabilizer, an adhesion imparting agent, a leveling agent, a stripping accelerator, an antioxidant, a perfume, an imaging agent, a thermal cross-linking agent, etc., the amount of each thereof being approximately 0.01 to 20 parts by weight relative to 100 parts by weight of the total of component (A) and component (B). They can be used singly or in a combination of two or more types.

The photosensitive resin composition used in the present invention can be dissolved, as necessary, in a solvent such as methanol, ethanol, acetone, methyl ethyl ketone, methyl Cellosolve, ethyl Cellosolve, toluene, N,N-dimethylformamide, or propylene glycol monomethyl ether, or a mixed solvent thereof, and applied as a solution having a solids content of about 30 to about 60 wt %. The use thereof is not particularly limited, but it is preferably applied as a liquid resist on the surface of a metal such as copper, a copper alloy, iron, or an iron alloy, dried, and then used with a protective film laminated thereto as necessary, or used in the form of a photosensitive element.

The photosensitive element according to the present invention, that is, a photosensitive element obtained by forming on a support a resist layer using the above-mentioned photosensitive resin composition according to the present invention is now explained by reference to drawings.

FIG. 1 shows schematically one embodiment of the photosensitive element. A photosensitive element 1 includes a support 11 and a resist layer (photosensitive resin composition layer) 12 formed thereon.

With regard to the support 11, a polymer film having heat resistance and solvent resistance, such as polyethylene terephthalate, polypropylene, polyethylene, or a polyester can be preferably used. The thickness of the polymer film forming the support is preferably 1 to 100 μm.

Although the method for forming the resist layer 12 on the support 11 is not particularly limited, it can be preferably obtained by coating the support 11 with a solution of a photosensitive resin composition and drying it. The coating thickness of the resist layer depends on the use, but is preferably about 1 to about 100 μm as a dry thickness, more preferably 3 to 80 μm, particularly preferably 5 to 50 μm, very preferably 10 to 45 μm, and most preferably 20 to 40 μm. The coating can be carried out by a known method such as a roll coater, a comma coater, a gravure coater, an air knife coater, a die coater, or a bar coater. The drying can be carried out at 70° C. to 150° C. for about 5 to about 30 minutes. It is also preferable for the amount of organic solvent remaining in the resist layer 12 to be 2 wt % or less from the viewpoint of preventing diffusion of the organic solvent in a subsequent step.

The surface of the resist layer 12 of the photosensitive element 1 is preferably covered with a protective film (not illustrated), which is a polymer film such as polyethylene or polypropylene. It is also possible to laminate any one of the polymer films as a support and another one of the polymer films as a protective film to opposite surfaces of the resist layer. It is preferable to choose the protective film so that the adhesive power between the resist layer and the protective film is less than that between the resist layer and the support, and a film having a low level of fisheyes is preferable. The thickness of the protective film is preferably at least 5 μm from the viewpoint of strength and at most 30 μm from the viewpoint of cost.

Since it should be possible to remove the support and the protective film from the resist layer later, they should not be subjected to a surface treatment that makes it impossible to remove them, but they may be subjected to a surface treatment as necessary. For example, the support and the protective film may be subjected to an antistatic treatment as necessary.

The photosensitive element having a two or three layer structure including the support, the resist layer, and the protective film as necessary may further include a middle layer or a protective layer such as a cushion layer, an adhesive layer, a light absorbing layer, or a gas barrier layer.

The photosensitive element thus obtained is stored in a roll form in which it is wound around a cylindrical core as it is or with a further protective film laminated to the surface of the resist layer. When winding, it is preferable for the support to be on the outermost side. End face separators are preferably placed on end faces of the photosensitive element roll thus wound from the viewpoint of protection of the end faces, and moisture-resistant end face separators are preferably placed from the viewpoint of resistance to edge fusion. Moreover, with regard to a packing method, it is preferable for it to be packaged by wrapping with a black sheet having low moisture permeability. As the core there can be cited, for example, a plastic such as a polyethylene resin, a polypropylene resin, a polystyrene resin, a polyvinyl chloride resin, and an ABS resin (acrylonitrile-butadiene-styrene copolymer).

A process for producing the resist pattern according to the present invention is now explained by reference to FIG. 2, which shows schematically one example of the steps thereof.

Figure 2A:
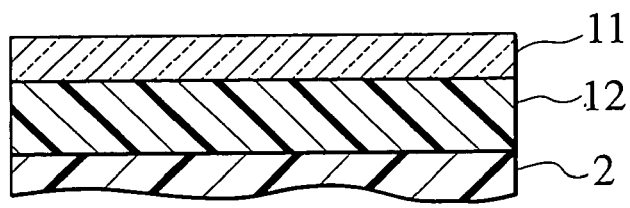
FIG. 2 is a schematic drawing showing an example of steps of the process for producing the resist pattern according to the present invention.

Firstly, in step (i) a resist layer is formed on a substrate 2 (substrate for a circuit to be formed on), the resist layer being formed from any one of the above-mentioned photosensitive resin compositions of the present invention. Any method can be employed for forming the resist layer and, for example, as shown in FIG. 2A, the above-mentioned photosensitive element 1 is laminated to the substrate 2 so that the resist layer 12 is bonded to the surface of the substrate 2. Prior to the lamination, in the case where a protective film (not illustrated) is present on the resist layer 12 of the photosensitive element 1, the protective film is removed. An example of the lamination method is a method in which the resist layer 12 is laminated to the substrate 2 by pressure-bonding with a pressure of about 0.1 to about 1 MPa (about 1 to about 10 kgf/cm$^2$) while heating the resist layer 12 at about 70° C. to about 130° C. It is also possible to carry out the lamination under reduced pressure. The surface of the substrate 2 to be laminated is usually a metal surface, but it is not particularly limited thereto. Furthermore, heating the resist layer at 70° C. to 130° C. as described above can eliminate the need for preheating the substrate, but in order to further improve the lamination performance, the substrate may be preheated.

Figure 2B:
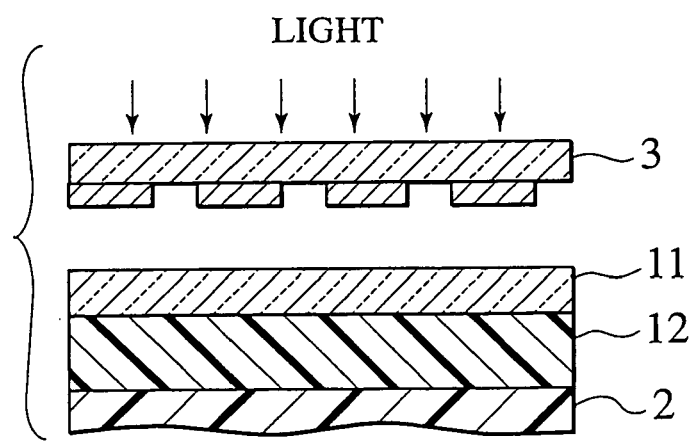

After formation of the resist layer is completed, in step (ii) the resist layer is imagewise exposed to actinic radiation so that an exposed area thereof is light cured. With regard to a method for imagewise exposure to actinic radiation, for example, as shown in FIG. 2B, the resist layer 12 is imagewise exposed to actinic radiation through a negative or positive mask pattern 3, which is called artwork, thereby light curing an exposed area of the resist layer 12. With regard to a source of light for the actinic radiation, a known source of light can be used, examples thereof including those that are effective in radiating ultraviolet, visible light, etc. such as a carbon arc lamp, a mercury-vapor arc lamp, a high pressure mercury lamp, and a xenon lamp. With regard to an exposure unit, a collimated light exposure unit is preferable from the viewpoint of achieving resolution and a high aspect ratio. Examples of the mask pattern include a PET mask pattern and a glass mask pattern, and from the viewpoint of preventing scattering and diffraction and achieving resolution and a high aspect ratio the glass pattern is preferable. The exposure in step (ii) can be carried out in a state in which the support 11 is present, as long as the resist layer 12 is not prevented from being exposed to radiation (in the case of a transparent support, etc.). It is also possible to carry out the exposure by direct laser imaging without having to use a mask pattern.

Figure 2C:
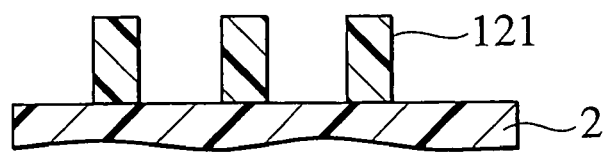

In the case where the support is present on the photosensitive resin composition layer subsequent to the exposure, after removing the support, in step (iii) selectively removing an unexposed area of the resist layer by development can form a resist pattern 121 as shown in FIG. 2C. The development is carried out by wet development, dry development, etc., and in the case of wet development a known method such as a dip method, a spray method, brushing, or slapping is employed using a developing solution corresponding to the composition of the resist layer, such as an alkaline aqueous solution, an aqueous developing solution, or an organic solvent. It is also possible to employ two or more types of development methods in combination as necessary. Examples of the above-mentioned alkaline aqueous solution include a 0.1 to 5 wt % diluted solution of sodium carbonate, a 0.1 to 5 wt % diluted solution of potassium carbonate, and a 0.1 to 5 wt % diluted solution of sodium hydroxide. The pH of the alkaline aqueous solution is preferably in the range of 9 to 11, and the temperature thereof is adjusted in line with the developability of the resist layer. The alkaline aqueous solution may contain a surfactant, an antifoaming agent, an organic solvent, etc.

As a post development treatment, the resist pattern so formed can be further cured by heating at about 60° C. to about 250° C. or by carrying out irradiation at about 0.2 to about 10 J/cm$^2$ as necessary.

In order to form fine copper wiring with reduced electrical resistance and increased copper wiring density, in the case where the film thickness is 1 to 100 μm, the resist pattern of the present invention has an aspect ratio of 3.5 or higher, preferably 3.8 or higher, more preferably 4.0 or higher, yet more preferably 4.3 or higher, particularly preferably 4.5 or higher, very preferably 4.8 or higher, and most preferably 5.0 or higher. The upper limit of the aspect ratio is preferably about 10.0 from the viewpoint of ease of production, etc., more preferably 8.0, and particularly preferably 6.0. The aspect ratio can be measured by, for example, an optical microscope or a scanning electron microscope (SEM). The 'line width of the resist pattern' when calculating the aspect ratio is preferably defined as the line width of the above-mentioned mask pattern for convenience of measurement.

The film thickness of the resist pattern is preferably 1 to 100 μm in order to further enhance the effects of the present invention, more preferably 3 to 80 μm, particularly preferably 5 to 50 μm, very preferably 10 to 45 μm, and most preferably 20 to 40 μm.

A method for the formation of wiring using the resist pattern of the present invention is now explained. When carrying out wiring formation using the resist pattern of the present invention, the surface of the substrate is subjected to a known treatment such as etching, plating, etc. using the developed resist pattern as a mask.

Until now, the circuits of printed wiring boards have mainly been formed by a subtractive process, that is, a technique involving forming a copper circuit by carrying out etching using a resist as a mask, but since lateral etching (side etching) occurs as well as longitudinal etching, it tends to be disadvantageous for forming a fine wiring pattern. In order to reduce the influence of such side etching, making the copper layer thinner makes a certain level of fine pattern formation possible, but it is anticipated that achieving a line/space (L/S) of 30 μm or less would be very difficult. Because of these reasons, an additive process can be considered as an effective technique for a semiconductor package substrate where formation of the finest copper wiring is required.

In the process for producing a semiconductor package substrate of the present invention, a circuit can also be produced more suitably by the additive process involving plating rather than by the subtractive process involving etching since the resist pattern of the present invention has an aspect ratio of 3.5 or higher when the film thickness is 1 to 100 μm. The process for producing a semiconductor package substrate according to the present invention therefore employs the additive process, and explanation is made below by reference to FIGS. 3 to 5, which show schematically one example of the steps thereof.

Figure 3:
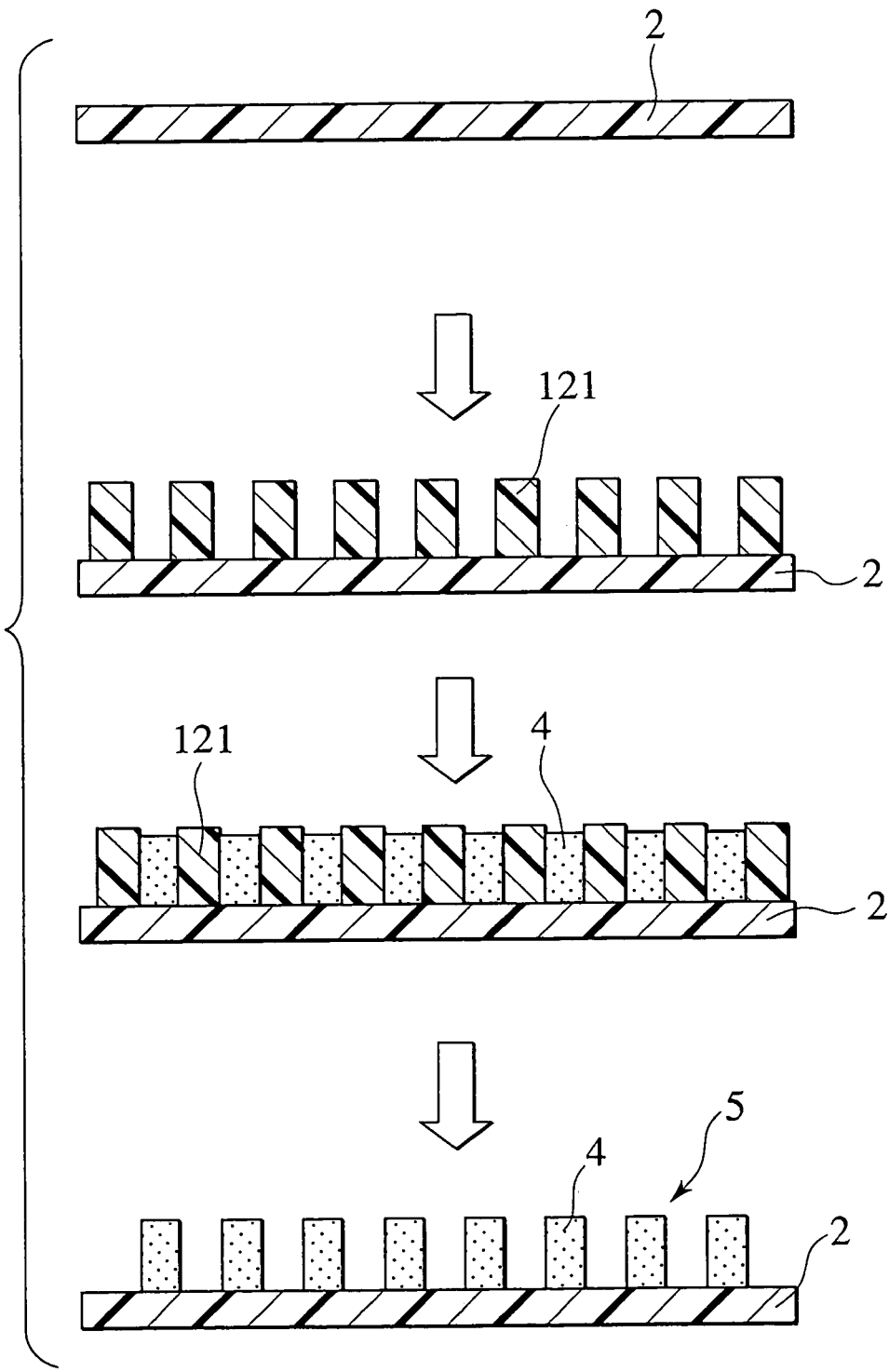
FIG. 3 is a schematic drawing showing an example of steps for producing the semiconductor package substrate according to the present invention by a full additive process.
Figure 4:
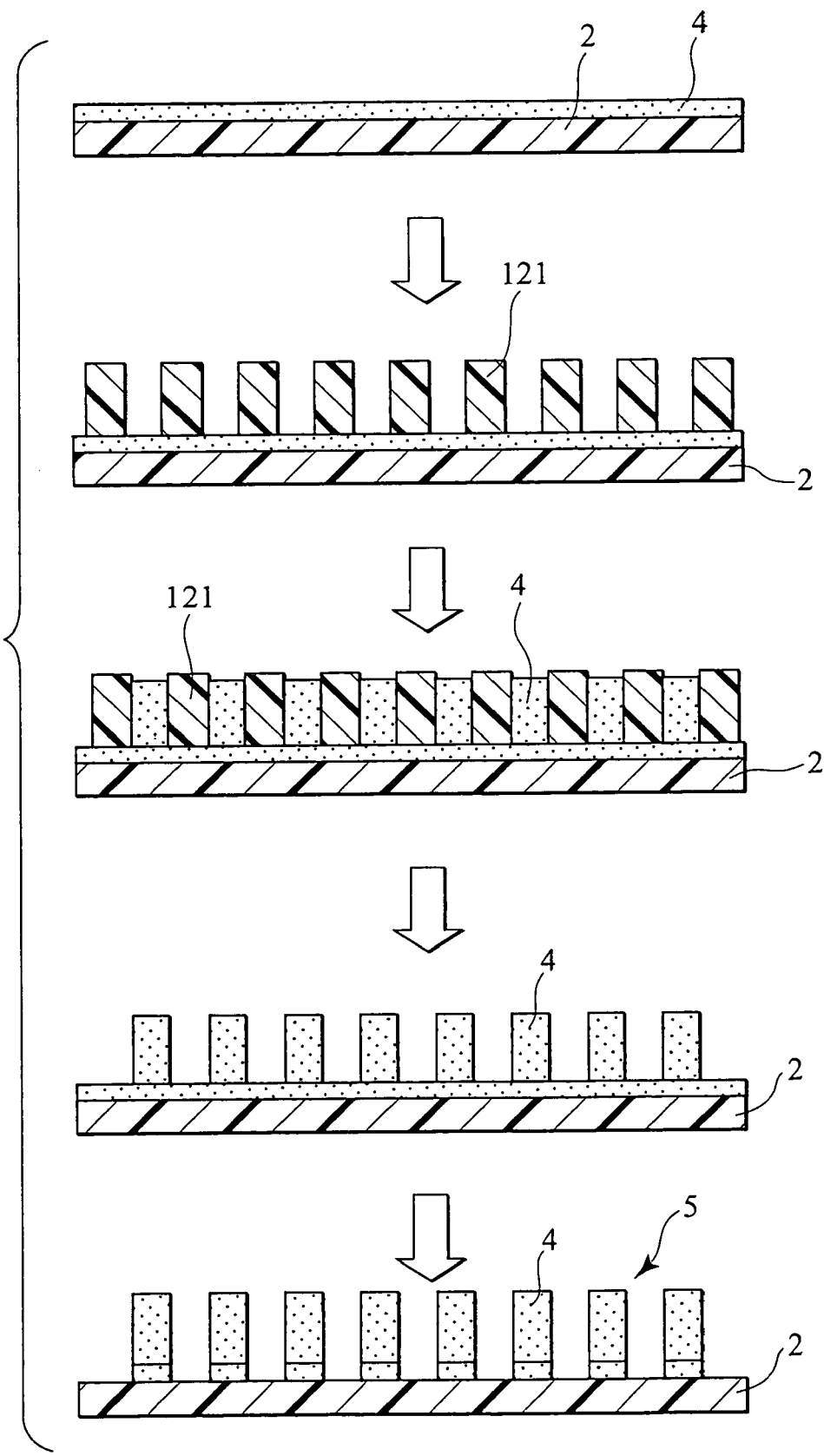
FIG. 4 is a schematic drawing showing an example of steps for producing the semiconductor package substrate according to the present invention by a semi additive process.
Figure 5:
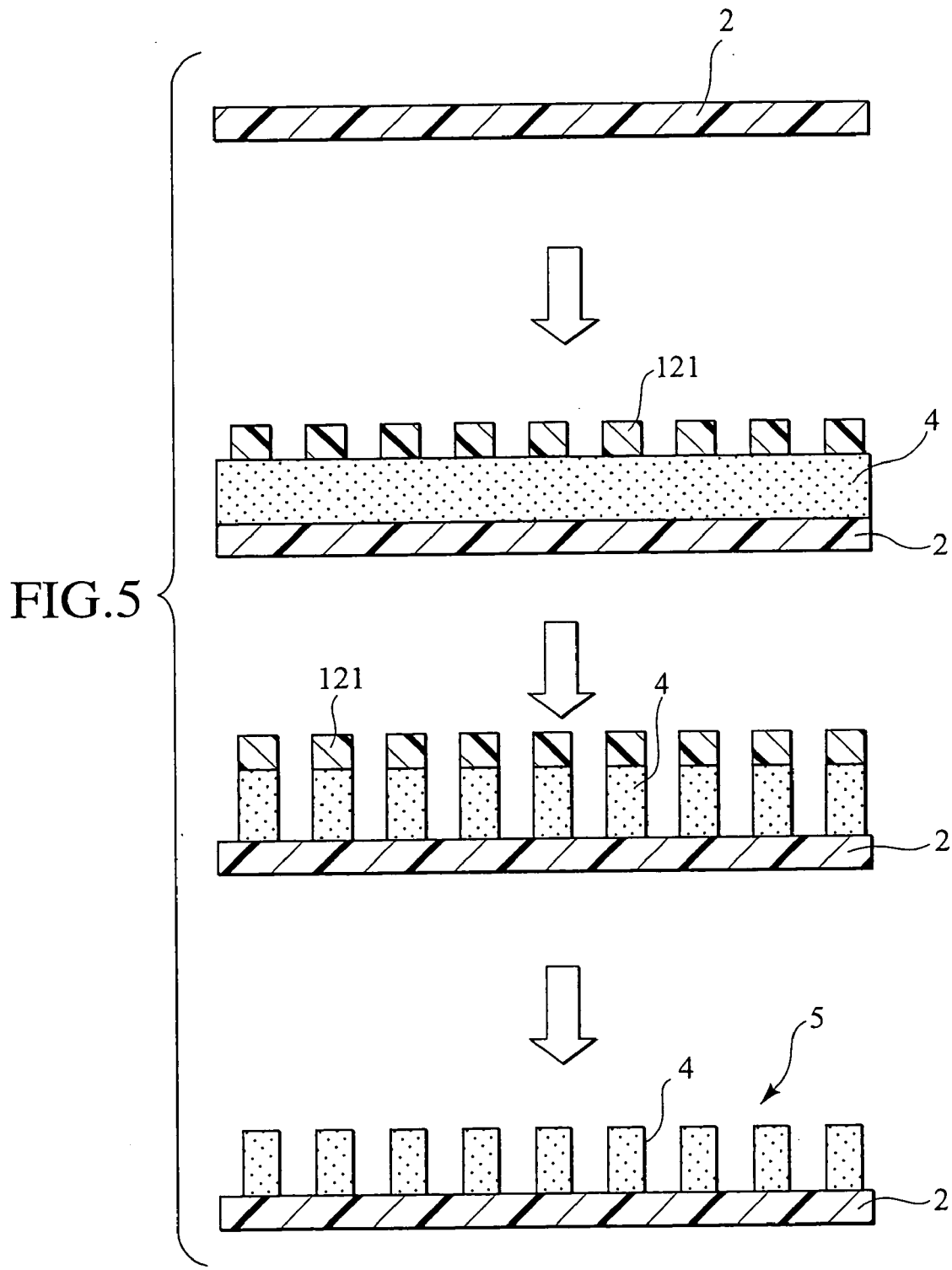
FIG. 5 is a schematic drawing showing an example of steps for producing the semiconductor package substrate according to the present invention by a panel additive process.

The additive process can be roughly divided into three processes, that is, a full additive process, a semi additive process, and a panel additive process. The full additive process is, as shown in FIG. 3, a process for producing a semiconductor package substrate 5 in which a resist pattern 121 is formed on a substrate 2 (substrate for a circuit to be formed on), a plating 4 such as electroless plating is subsequently applied to gaps in the resist pattern, and the resist pattern 121 is then stripped to give a wiring pattern. The semi additive process is, as shown in FIG. 4, a process for producing a semiconductor package substrate 5 in which a resist pattern 121 is formed on a substrate 2 that has been subjected in advance to a plating 4 such as electroless plating, the plating 4 such as electroplating is subsequently applied to gaps in the resist pattern, the resist pattern 121 is then stripped, and the electroless plating applied in advance to the substrate is finally subjected to quick etching using the electroplated pattern as a mask to give a wiring pattern. The panel additive process is, as shown in FIG. 5, a process for producing a semiconductor package substrate 5 in which a plating 4 such as electroless plating required as wiring is applied to a substrate 2, a resist pattern 121 is formed thereon, etching is subsequently carried out, and the resist pattern 121 is then stripped to give a wiring pattern. In the present invention, the semi additive process is particularly effective.

Examples of the plating include copper plating, solder plating, nickel plating, and gold plating. Stripping of the resist pattern can be carried out using an aqueous solution that is more strongly alkaline than the alkaline aqueous solution used for the development. As the strongly alkaline aqueous solution, a 1 to 10 wt % aqueous solution of sodium hydroxide, a 1 to 10 wt % aqueous solution of potassium hydroxide, etc. can be used. Examples of the stripping method include an immersion method and a spray method.

In addition, when wiring is formed using the resist pattern of the present invention by the subtractive process involving etching instead of the above-mentioned additive process, the metal surface can be etched using, for example, a cupric chloride solution, a ferric chloride solution, an alkaline etching solution, or a hydrogen peroxide-based etching solution.

Because the resist pattern of the present invention can provide a high wiring density, it is preferably used for the production of a semiconductor package substrate, but it can also be used for the production of a printed wiring board. The printed wiring board in this case may be a multilayer printed wiring board and may have small diameter through holes.

Since the resist pattern according to the present invention has high resolution and a high aspect ratio, use thereof enables a low conductor resistance to be maintained in fine wiring, and it is useful for increasing the density of a semiconductor package substrate circuit.

The photosensitive resin composition and the photosensitive element according to the present invention are used as resist materials for pattern formation, can provide a resist pattern or a group of resist patterns that have high resolution and a high aspect ratio and are useful for increasing the density of a semiconductor package substrate circuit, and have excellent sensitivity, resolution, resistance to scumming, plating resistance, workability, and productivity.

In accordance with the process for producing a resist pattern according to the present invention, a resist pattern having high resolution and a high aspect ratio can be produced with good workability and productivity. Use of the process enables a low conductor resistance to be maintained in fine wiring, and is useful for increasing the density of a semiconductor package substrate circuit.

In accordance with the process for producing a semiconductor package substrate according to the present invention, since fine wiring in which a low conductor resistance is maintained can be carried out with good workability and productivity using as a mask a resist pattern having high resolution and a high aspect ratio, the process is useful for increasing the density of a semiconductor package substrate circuit.

The present invention is now explained further in detail by reference to experimental examples.

EXPERIMENTAL EXAMPLES 1 TO 7

A solution A was prepared by mixing the components shown in TABLE 1.

In the solution A thus obtained were then dissolved the components (B) and (D) shown in TABLE 2 to give a solution of a photosensitive resin composition of each of the experimental examples.

The Compounds listed in TABLE 2 are shown below.

A-TMM-3 (trade name, manufactured by Shin-Nakamura Chemical Co., Ltd.): tetramethylolmethane triacrylate represented by the formula below

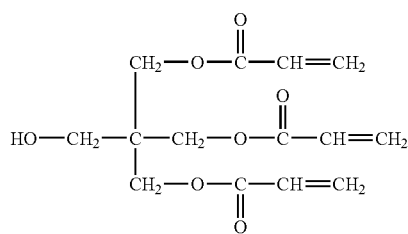

TMPT21E (sample name, produced by Hitachi Chemical Co., Ltd.): an EO-modified trimethylolpropane trimethacrylate represented by the formula below

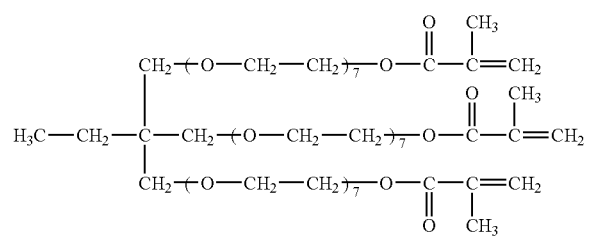

BPE500 (trade name, manufactured by Shin-Nakamura Chemical Co., Ltd.): a compound represented by the formula below where p+q=10 (2,2-bis(4-(methacryloxypentaethoxy)phenyl)propane)

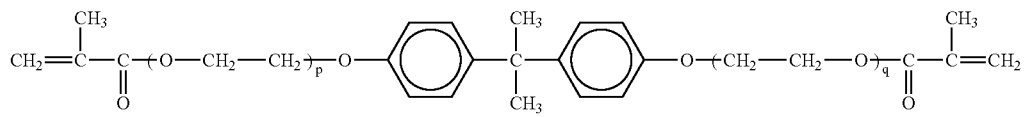

BP(EO)14MA: a compound represented by the formula above where p+q=14 (2,2-bis(4-(methacryloxyheptaethoxy)phenyl)propane)

4G (trade name, manufactured by Shin-Nakamura Chemical Co., Ltd.): tetraethylene glycol dimethacrylate 9G (trade name, manufactured by Shin-Nakamura Chemical Co., Ltd.): nonaethylene glycol dimethacrylate 9PG (trade name, manufactured by Shin-Nakamura Chemical Co., Ltd.): nonapropylene glycol dimethacrylate NP-4EA (trade name, manufactured by Kyoeisha Chemical Co., Ltd.): nonylphenoxytetraethyleneoxy acrylate represented by the formula below

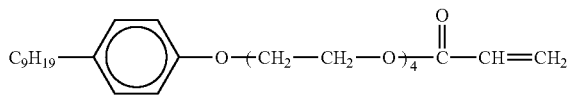

NP-8EA (trade name, manufactured by Kyoeisha Chemical Co., Ltd.): nonylphenoxyoctaethyleneoxy acrylate represented by the formula below

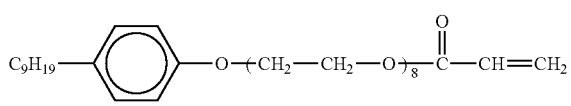

Catechol: a compound represented by the formula below

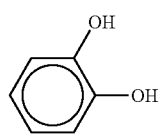

4-tert-Butylcatechol: a compound represented by the formula below

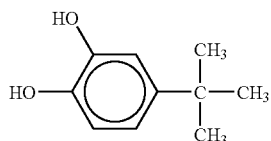

2,5-Di-tert-butylhydroquinone: a compound represented by the formula below

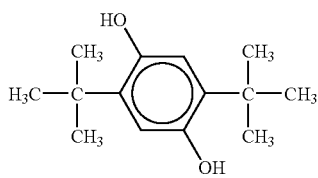

2,6-Di-tert-butyl-p-cresol: a compound represented by the formula below

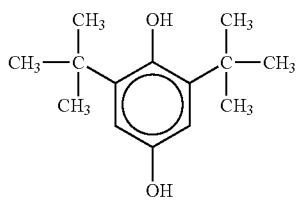

A 16 μm thick polyethylene terephthalate film was then uniformly coated with the solution of the photosensitive resin composition of each of the experimental examples, and dried in a hot air convection dryer at 100° C. for 10 minutes to give a photosensitive element. The film thickness of the resist layer (photosensitive resin composition layer) thus obtained was 30 μm. The absorbance for ultraviolet radiation having a wavelength of 365 nm of the resist layer thus obtained was measured using a UV spectrometer (a U-3410 spectrophotometer, manufactured by Hitachi Ltd.) Firstly, the photosensitive element thus obtained was placed on the sample side, a support film was placed on the reference side, the absorbance was measured continuously in the range of 700 to 300 nm, and the value at 365 nm was read off. The absorbance for ultraviolet radiation having a wavelength of 365 nm was 1.2 in all cases for the resist layers of Experimental Examples 1 to 7.

A copper surface of a copper-clad laminate (MCL-E-61, trade name, manufactured by Hitachi Chemical Co., Ltd.), which is a glass epoxy material with copper foil (thickness 35 μm) laminated to opposite surfaces thereof, was polished using a polishing machine (manufactured by Sankei Co., Ltd.) having a #600 equivalent brush, water-washed, and dried under a flow of air, the copper-clad laminate thus treated was heated to 80° C., and the resist layer above of each of the experimental examples was laminated to the copper surface thereof while heating at 110° C. to give a test piece.

<Sensitivity>

A Stouffer 41 step tablet was placed on the test piece as a negative, and the test piece was exposed at 60 mJ/cm$^2$, 120 mJ/cm$^2$, and 240 mJ/cm$^2$ using an HMW 590 collimated light exposure unit having a high pressure mercury lamp (manufactured by ORC Manufacturing Co., Ltd.). After the exposure, the polyethylene terephthalate film was peeled off, and a 1 wt % aqueous solution of sodium carbonate was sprayed at 30° C. for 20 seconds so as to remove the unexposed portion.

The sensitivity of the photosensitive resin composition was evaluated by measuring the number of steps of the step tablet of a light cured film formed on the copper-clad laminate, and the sensitivity was expressed as an exposure (mJ/cm$^2$) necessary to cure 15 steps of the 41 step tablet (O.D.=0.05). The results thus obtained are given in TABLE 3. The lower the value, the higher the sensitivity.

<Resolution>

Each test piece was exposed at an exposure determined above using a glass mask pattern as a negative and developed. The developed pattern was inspected and the resolution (μm) was obtained from a line width (μm) remaining as a line-and-space. In the evaluation of the resolution, the smaller the value the better.

<Aspect Ratio>

The aspect ratio was obtained from the film thickness (30 μm) of the resist layer and the line width (resolution) obtained above using equation (2) above.

<Stripping Time>

A test piece that had been exposed at an exposure (15 steps/41) corresponding to its sensitivity was developed using a 1 wt % aqueous solution of sodium carbonate. After allowing the test piece thus obtained to stand for one day, it was immersed in a 3 wt % aqueous solution of sodium hydroxide maintained at 45° C. while stirring using a stirrer, and the time (seconds) taken for stripping to start was measured. A shorter stripping time is preferred.

<Scumming>

0.5 m$^2$ of unexposed film of each test piece was dissolved in 1 L of a 1 wt % aqueous solution of sodium carbonate, and the solution was circulated in a spray developing machine at 30° C. for 90 minutes. After allowing it to stand for 2 minutes, an oily product attached to a wall of the developing machine was inspected, and the scumming was evaluated using the criteria shown below. The larger the number, the better the properties.

3: no oily product.
2: a small amount of oily product.
1: a large amount of oily product.

<Plating Resistance>

Each test piece was exposed using a mask at an exposure (15 steps/41) corresponding to its sensitivity, and developed using a 1 wt % aqueous solution of sodium carbonate. These samples were degreased, water-washed, plated with copper sulfate at 3.0 A/dm$^2$ for 30 minutes, water-washed and immersed in fluoroboric acid, then solder-plated at 1.5 A/dm$^2$ for 10 minutes, and water-washed. The moisture was removed by an air brush, cellophane tape (24 mm wide, manufactured by Sekisui Chemical Co., Ltd.) was adhered to the sample and rapidly peeled off, and the presence or absence of stripping was examined.

Good: no stripping.
Poor: stripping.

The results of the evaluation of each experimental example are given in TABLE 3.

TABLE 1

| | Amount added/parts by weight | |
|---|---|---|
| Component (A) | Solution of copolymer of methacrylic acid/methyl methacrylate/styrene (ratio by weight 29/46/25) (weight-average molecular weight = 45,000) in methyl Cellosolve/toluene, solids content acid value = 189 mg KOH/g | Solids content 52 (solution 120) |
| Component (C) | 2,2'-Bis(2-chlorophenyl)-4,4',5,5'-tetraphenylbisimidazole | 3.0 |
| | 4,4'-Bis(diethylamino)benzophenone | 0.3 |
| Component (E) | Leuco crystal violet | 0.2 |
| Dye | Malachite green | 0.08 |
| Solvent | Acetone | 10 |
| | Toluene | 7 |
| | N,N'-Dimethylformamide | 3 |
| | Methanol | 3 |

TABLE 2

| Amount added/parts by weight | | Experimental Example | | | | | | |
|---|---|---|---|---|---|---|---|---|
| | | 1 | 2 | 3 | 4 | 5 | 6 | 7 |
| Component (B1) | A-TMM-3 | 10 | — | — | — | 10 | 10 | — |
| | TMPT21E | — | 10 | 10 | 10 | — | — | — |
| Component (B2) | 4G | 10 | 10 | 10 | — | — | — | — |
| | 9G | — | — | — | 10 | 10 | 10 | — |
| | 9PG | — | — | — | — | — | — | 10 |
| Component (B3) | BPE-500 | 20 | 20 | — | — | 20 | 20 | 20 |
| | BP (EO) 14MA | — | — | 20 | 20 | — | — | — |
| Component (B4) | NP-4EA | 8 | 8 | — | — | 8 | 8 | 8 |
| | NP-8EA | — | — | 8 | 8 | — | — | 18 |
| Component (D) | Catechol | 0.05 | — | — | 0.05 | — | — | 0.05 |
| | 4-tert-Butylcatechol | — | 0.05 | — | — | — | — | — |
| | 2,5-Di-tert-butyl hydroquinone | — | — | 0.05 | — | — | — | — |
| (Monohydric phenol compound) 2,6-Di-tert-butyl-p-cresol | | — | — | — | — | — | 0.05 | — |

TABLE 3

| | Experimental Example | | | | | | |
|---|---|---|---|---|---|---|---|
| | 1 | 2 | 3 | 4 | 5 | 6 | 7 |
| Film thickness (μm) | 30 | 30 | 30 | 30 | 30 | 30 | 30 |
| Sensitivity (mJ/cm$^2$) | 150 | 150 | 150 | 150 | 70 | 80 | 150 |
| Resolution (μm) | 8.6 | 7 | 8.6 | 7 | 15 | 15 | 10 |
| Aspect ratio | 3.5 | 4.3 | 3.5 | 4.3 | 2.0 | 2.0 | 3.0 |
| Stripping time (sec) | 50 | 50 | 55 | 55 | 40 | 50 | 40 |
| Scumming | 3 | 3 | 3 | 3 | 3 | 3 | 3 |
| Plating resistance | Good | Good | Good | Good | Good | Good | Good |

EXPERIMENTAL EXAMPLES 8 TO 12

A solution B was prepared by mixing the components shown in TABLE 4.

In the solution B thus obtained were then dissolved the components (B) and (D) shown in TABLE 5 to give a solution of a photosensitive resin composition of each of the experimental examples.

A compound listed in TABLE 5 is shown below.

SR454 (manufactured by Sartomer Company): an EO-modified trimethylolpropane triacrylate represented by the formula below

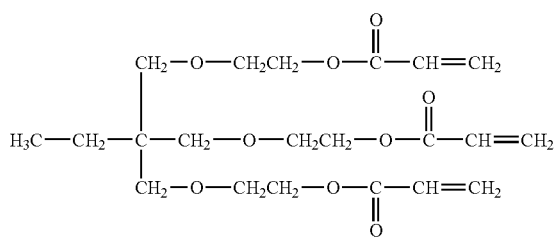

A photosensitive element was obtained in the same manner as in Experimental Example 1, etc. except that the solution of the photosensitive resin composition above was used, and the sensitivity, the resolution, the stripping time, the scumming, and the plating resistance of each test piece were evaluated in the same manner. The results of the evaluation are given in TABLE 6. The absorbance for ultraviolet radiation having a wavelength of 365 nm was 0.38 in all cases for the resist layers of Experimental Examples 8 to 12.

TABLE 4

| Amount added/parts by weight | | | |
|---|---|---|---|
| Component (A) | Solution of copolymer of methacrylic acid/methyl methacrylate/styrene/butyl methacrylate/ethyl acrylate (ratio by weight 30/22/30/8/10) (weight-average molecular weight = 50,000) in methyl Cellosolve/toluene, solids content acid value = 194 mg KOH/g | Solids content 58 (solution 130) | |
| Component (C) | 2,2'-Bis(2-chlorophenyl)-4,4',5,5'-tetraphenylbisimidazole | 3.2 | |
| | 4,4'-Bis(diethylamino)benzophenone | 0.05 | |
| Component (E) | Leuco crystal violet | 0.4 | |
| Dye | Malachite green | 0.04 | |
| Solvent | Acetone | 10 | |
| | Toluene | 7 | |
| | N,N'-Dimethylformamide | 3 | |
| | Methanol | 3 | |

TABLE 5

| Amount added/parts by weight | | Experimental Example | | | | |
|---|---|---|---|---|---|---|
| | | 8 | 9 | 10 | 11 | 12 |
| Component (B1) | SR454 | 4 | 4 | 8 | — | — |
| | TMPT21E | — | — | — | 8 | 4 |
| Component (B2) | 4G | — | 6 | 6 | 6 | — |
| | 9G | 6 | — | — | — | 6 |
| Component (B3) | BPE-500 | — | 28 | — | 24 | 28 |
| | BP (EO) 14MA | 28 | — | 24 | — | — |
| Component (B4) | NP-4EA | 4 | 4 | 4 | 4 | 4 |
| Component (D) | 4-tert-Butylcatechol | 0.04 | 0.04 | 0.04 | 0.04 | 0.04 |

TABLE 6

| | Experimental Example | | | | |
|---|---|---|---|---|---|
| | 8 | 9 | 10 | 11 | 12 |
| Film thickness (μm) | 30 | 30 | 30 | 30 | 30 |
| Sensitivity (mJ/cm$^2$) | 190 | 190 | 190 | 190 | 190 |
| Resolution (μm) | 6.2 | 6.2 | 6.2 | 6.2 | 5.5 |
| Aspect ratio | 4.8 | 4.8 | 4.8 | 4.8 | 5.4 |
| Stripping time (sec) | 50 | 50 | 50 | 55 | 50 |
| Scumming | 3 | 3 | 3 | 3 | 3 |
| Plating resistance | Good | Good | Good | Good | Good |

Figure 6A:
FIG. 6 shows SEM photographs of a magnified part of a resist pattern obtained in an experimental example of the present invention.
Figure 6B:
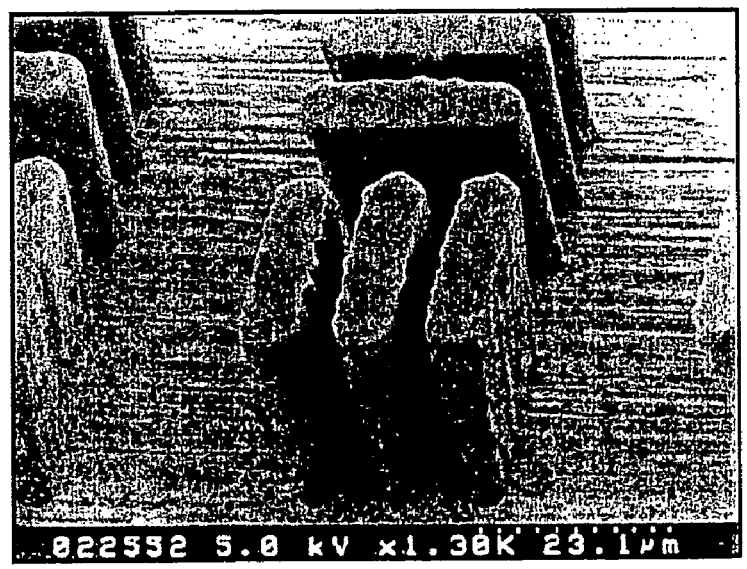

FIGS. 6A and 6B show SEM photographs of parts of the resist patterns having an aspect ratio of 4.8 to 5.4 obtained in Experimental Examples 8 to 12 (the line width was 6.2 μm for 6A and 5.5 μm for 6B). As is clear from FIG. 6, resist patterns having high resolution and a high aspect ratio were obtained in which the resist pattern did not collapse and there was no tailing in the rectangular cross sectional profile.

The above-mentioned experimental examples gave resist patterns having a high aspect ratio of 3.5 or higher and having good properties in terms of the sensitivity, the resolution, the stripping time, the scumming, and the plating resistance. These high aspect ratio resist patterns enable fine copper wiring to be formed and are excellent for making a semiconductor package substrate. The copper wiring formed therefrom had a sufficient cross section and a low electrical resistance.

The disclosure of the present application is related to the subject matter of Japanese Patent Application No. 2000-293255 filed on Sep. 27, 2000, Japanese Patent Application No. 2000-320168 filed on Oct. 20, 2000, and Japanese Patent Application No. 2001-275523 filed on Sep. 11, 2001, the disclosure of which is incorporated herein by reference.

It is to be noted that, besides those already mentioned above, various changes and modification can be made in the above-mentioned embodiments without departing from the novel and advantageous features of the present invention. Therefore, all such changes and modifications are intended to be included within the scope of the appended claims.

The invention claimed is:

1. A photosensitive resin composition that can produce a resist pattern having a film thickness of 1 to 100 μm and an aspect ratio of 3.5 or higher, comprising:
   (A) a binder polymer including a monomer selected from the group consisting of one or more of styrene and a polymerizable styrene derivative;
   (B) a photopolymerizable compound having at least one ethylenically unsaturated bond per molecule; and
   (C) a photopolymerization initiator comprising 2, 4, 5-tri-arylimidazole dimer, wherein the aspect ratio is a ratio of line width to the film thickness of the resist pattern.

2. The photosensitive resin composition according to claim 1 wherein the photosensitive resin composition can produce a resist pattern having the aspect ratio of 4.0 or higher.

3. The photosensitive resin composition according to claim 1 wherein photosensitive resin composition can produce a resist pattern having the aspect ratio of 4.5 or higher.

4. The photosensitive resin composition according to claim 1 wherein photosensitive resin composition can produce a resist pattern having the film thickness of 5 to 50 μm.

5. The photosensitive resin composition according to claim 1 wherein photosensitive resin composition can produce a resist pattern having the film thickness of 20 to 40 μm.

6. The photosensitive resin composition according to claim 1, comprising, as component (B), (B1) a photopolymerizable compound having three ethylenically unsaturated bonds per molecule.

7. The photosensitive resin composition according to claim 1, comprising, as a component (D), either or both of a compound represented by general formula (I):

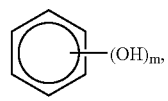

wherein in the formula (I), m is an integer of 2 to 6, or a compound represented by general formula (11)

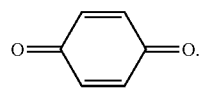

8. A photosensitive element obtained by forming on a support a resist layer formed from the photosensitive resin composition according to claim 1.

9. The photosensitive resin composition according to claim 1, comprising, as the component (B), (B2) a 2,2-bis (4-((meth)acryloxypolyalkoxy) phenyl)propane).

* * * * *